United States Patent [19]
Saxena

[11] Patent Number: 6,103,019
[45] Date of Patent: Aug. 15, 2000

[54] ADVANCED TECHNIQUE TO GROW SINGLE CRYSTAL FILMS ON AMORPHOUS AND/OR NON-SINGLE CRYSTAL SURFACES

[76] Inventor: Arjun Saxena, 2 Birch Hill Rd., Ballston Lake, N.Y. 12019-9370

[21] Appl. No.: 09/025,724
[22] Filed: Feb. 18, 1998

Related U.S. Application Data

[63] Continuation of application No. 08/140,723, Oct. 21, 1993, Pat. No. 5,792,270.
[51] Int. Cl.$^7$ .................................................. C30B 29/06
[52] U.S. Cl. .......................... 148/33; 148/33.2; 148/33.4; 117/95; 117/96; 117/101; 117/913; 117/923; 117/935
[58] Field of Search ................................ 117/101, 95, 96, 117/935, 913, 923; 148/33, 33.2, 33.4

[56] References Cited

U.S. PATENT DOCUMENTS

| | | | |
|---|---|---|---|
| 4,235,662 | 11/1980 | Reitz | 117/101 |
| 4,686,758 | 8/1987 | Liu et al. | 437/34 |
| 4,999,313 | 3/1991 | Arikawa et al. | 117/913 |
| 5,113,072 | 5/1992 | Yamaguchi et al. | 250/309 |
| 5,447,117 | 9/1995 | Yonehara et al. | 117/913 |
| 5,472,508 | 12/1995 | Saxena | 118/723 E |
| 5,653,802 | 8/1997 | Yamagata | 117/95 |
| 5,690,736 | 11/1997 | Tokunga | 117/95 |
| 5,733,369 | 3/1998 | Yonehara et al. | 117/95 |

FOREIGN PATENT DOCUMENTS 0 339 793 A1  2/1989  European Pat. Off. .

OTHER PUBLICATIONS

Saxena et al., Technology and Reliability Issues of Multi-level Interconnects in Bipolar,BiCMOS and CMOS VLSIC/ULSICs, IEEE 1993 Bipolar Circuits and Technology Meeting 1.1, Oct. 1993, pp. 12–19.

*Primary Examiner*—Benjamin L. Utech
*Attorney, Agent, or Firm*—Fliesler, Dubb, Meyer & Lovejoy LLP; Gideon Gimlan

[57] ABSTRACT

A method for producing a pattern of regularly spaced-apart nucleation sites and corresponding devices are disclosed. The method enables formation of a device having an amorphous or otherwise non-single crystal surface from which single crystal layers of a desired orientation may be grown using the regularly spaced nucleation sites as a growth template. The method can be used to produce a single crystal semiconductor layer of a desired orientation (e.g., <100> or <111>) on an amorphous insulating layer (e.g. of $SiO_2$ or $Si_3N_4$). For example, single crystal Si of a <100> orientation may be grown on an $SiO_2$ layer. Monocrystalline semiconductor films may be similarly grown on amorphous glass substrates or the like for producing solar cells of high efficiency and low cost. The pattern of regularly spaced-apart nucleation sites may be created by high-dose implantation of a nucleating species through a single crystal mask having appropriate channeling directions spaced at desired lattice constants. Subsequent to creation of spaced-apart nucleation sites, monocrystals such as that of silicon may be epitaxially grown from the surface that has the regularly spaced-apart nucleation sites.

28 Claims, 2 Drawing Sheets

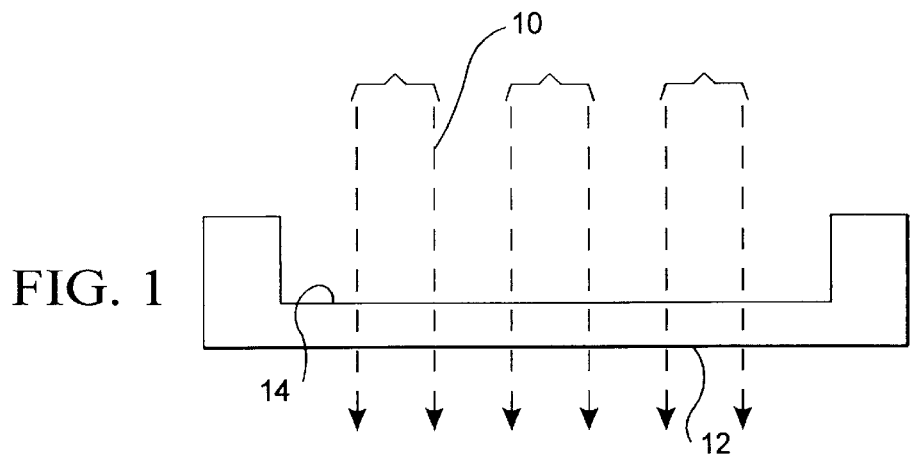
FIG. 1
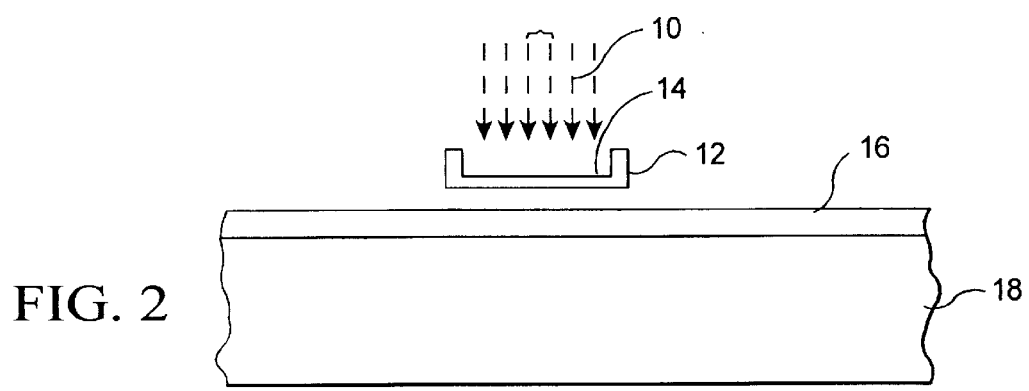
FIG. 2
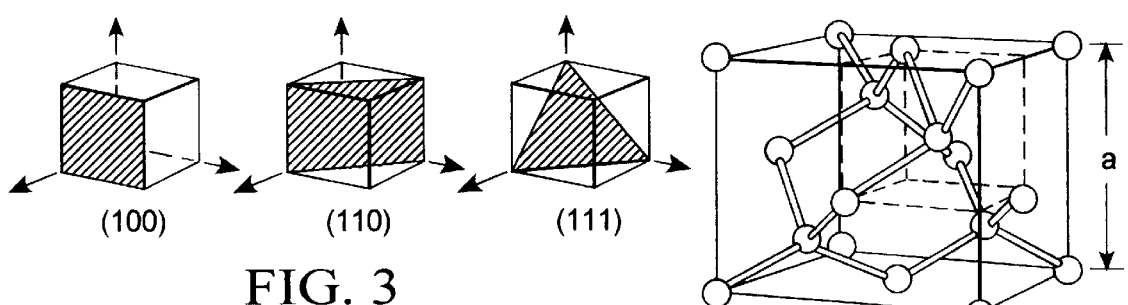
(100)  (110)  (111)
FIG. 3
FIG. 4
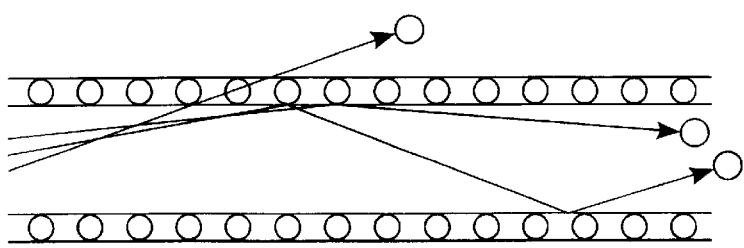
FIG. 5

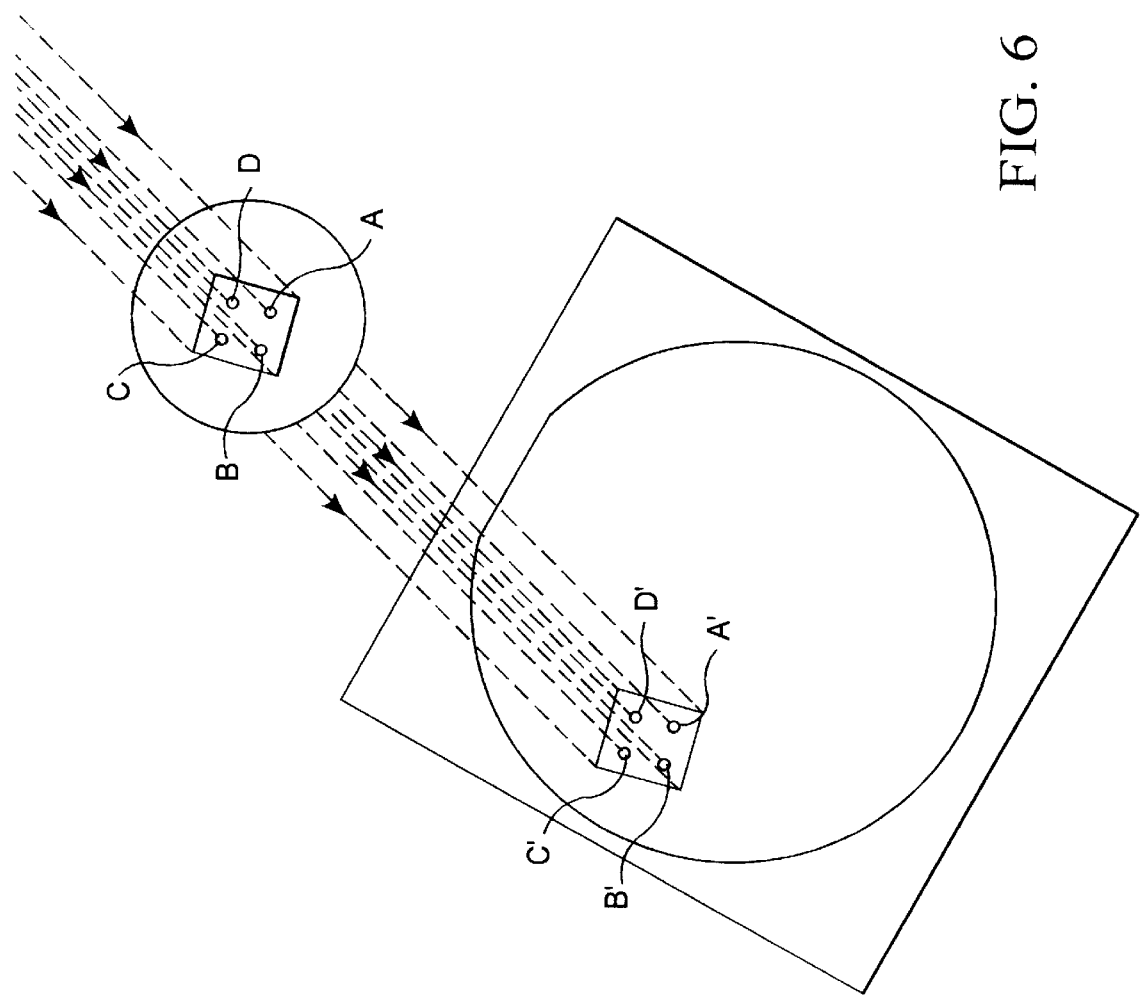

ADVANCED TECHNIQUE TO GROW SINGLE CRYSTAL FILMS ON AMORPHOUS AND/OR NON-SINGLE CRYSTAL SURFACES

This application continues from Ser. No. 08/140,723, filed Oct. 21, 1993, now U.S. Pat. No. 5,792,270. The disclosure of said application is incorporated herein by reference.

BACKGROUND OF THE INVENTION

In the current integrated circuit (IC) business, whose total world market is in excess of $60 billion, all of the ICs are manufactured using a 2-dimensional (2-D) technology. This means that all of the IC chips on a single crystal silicon (Si) wafer uses various types of transistors and diodes laid out on the Si surface in a 2-D manner. In such a manufacturing technology, single crystal layers having the same orientation as the Si wafer, known as epitaxial layers are grown on the Si wafer substrate.

This invention relates to the growth of single crystals on amorphous and non-crystal surfaces. The most widely used processes for growing epitaxial layers of Si are chemical vapor deposition (CVD) processes. They use chemicals/gases such as $SiCl_4$, $SiHCl_3$ and $SiH_2Cl_2$ with $H_2$ as the carrier and reduction gas in a CVD reactor, at temperatures in the range of 950–1100° C. This is well known, and such CVD processes for the epitaxial grown or deposition of single crystal layers of Si are widely used in IC manufacturing.

Typical chemical reactions which take place, as an example, in the $H_2$ reduction of $SiCl_4$ are given below:

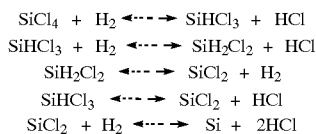

The single crystal quality of the epitaxial Si film depends on several factors, such as the crystal perfection of the regions of the single crystal Si substrate, its cleanliness, the rate of deposition of the Si film, and the purity of the gases. These criteria are known to those conversant in the state of the art. However, these processes are limited to growing or depositing epitaxial Si films on single crystal Si substrates (homoepitaxy) which can be used only to manufacture 2-D ICs.

Homoepitaxy processes to grow single crystal films of compound semiconductors, such as gallium arsenide (GaAs), similar to those described above, are available and used for manufacturing compound semiconductor ICs. These are also limited to manufacturing only 2-D compound semiconductor ICs. As an example, GaAs ICs using Schottky technology are dominant for monolithic microwave ICs (MMICs). The CVD, liquid phase epitaxial (LPE) and molecular beam epitaxial (MBE) processes obviously use Ga, As, and their compounds in the appropriate processes. These are also well known to those conversant in the state of the art. The total business volume of 2-D compound semiconductor ICs is much smaller than that of the 2-D Si ICs. Nevertheless, because of the unique performance capabilities of the compound semiconductor devices and ICs for optical (lasers and detectors) and microwave applications, they are very important.

The level of integration in Si Ics, in terms of device density, can be increased beyond the 2-D limit by invoking device fabrication in the third dimension, i.e. by manufacturing 3-D ICs. This would enhance the functionality and the performance of Si ICs beyond the limits of the current 2-D technologies. However, to accomplish this, single crystal Si layers need to be grown over the silicon dioxide ($SiO_2$) layers used in the 2-D ICs. No production worthy technology is available yet to do this. One of the approaches is to use epitaxial lateral overgrowth (ELO) technology, in which seeding from the substrate is used to grow (epitaxial Si layers over $SiO_2$ layers (Ref. 1: M. S. Liu and B. Hoefflinger, "Three-Dimensional CMOS Using Selective Epitaxial Growth", U.S. Pat. No. 4,686,758, Aug. 18, 1987). Another approach is to bond two single crystal Si wafers with an $SiO_2$ layer in between the two.

It is also of interest to grow single crystal Si layers on the single crystal compound semiconductor such as GaAs. This feature of growing two dissimilar single crystal material, one on top of the other, is known as heteroepitaxy. Combining the best of both the worlds of Si and compound semiconductor ICs leads to ultra performance ICs (UPICs) which are the ultimate in the ICs known to mankind (Ref. 2: A. N. Saxena et al., "Technology and Reliability Issues of Multilevel Interconnects in Bipolar, BiCMOS and CMOS VLSIC/ULSIC", Proc. IEEE Bipolar/BiCMOS Circuits and Technology Meeting (BCTM), pp. 12–19, 1993). Thus, the maximum functionality, reliability and low power of Si ICs can be integrated monolithically with the unique performance (optical and microwave) capabilities of compound semiconductor ICs to produce UPICS. No production worthy technology to grow the heteroepitaxy layers is available so far.

SUMMARY OF THE INVENTION

The purpose of the present invention is to enable the growth and deposition of single crystal layers of any desired orientation of almost any material (semiconductor, metal or insulator) on a suitable amorphous and/or non-single crystal surface. More importantly, it will produce single crystal Si layers of any desired orientation on an amorphous layer, e.g. of $SiO_2$ or $Si_3N_4$. More specifically, it will allow growth of (100) crystal orientation on $SiO_2$, which is the most desirable orientation for the manufacturing of complementary metal-oxide-semiconductor (MOS) ICs. The CMOS ICs are the largest and the most important segment of the entire IC technology and business. Thus, as an is example, growth of a single crystal layer of (100) orientation on $SiO_2$ or $Si_3N_4$ films on processed GaAs wafers having MMICs can enable microprocessor types of circuits to be fabricated monolithically, which will be a superior telecommunication IC than any kind available today.

The present invention also enables large area semiconductor films to be grown on amorphous glass substrates, which could be used for producing solar cells of high efficiency. This feature of the invention may make it very important in producing electric power from sunlight economically, which will become more and more attractive with the passage of time and as natural fossil fuels are depleted. This feature of the present invention will also allow the fabrication of large area flat panel displays which will be superior to those currently known.

The unique feature of the present invention is to enable the growth of any crystal structure on amorphous substrates and can be utilized to grow single crystal layers of high $T_C$ superconductors. This capability will allow high critical currents to be achieved in high Tc superconductors, which is an important limitation in today's technology.

The key feature of the present invention is to create nucleation sites in the amorphous layers, e.g. $SiO_2$ on an IC wafer, by high-dose implantation through a mask having appropriate channeling directions at the desired lattice constants. Such implantation may be performed in a conventional ion implanter, or it may be performed in an apparatus of the Applicant's invention (Ref. 3). Subsequent to this creation of nucleation sites, epitaxial Si is grown on such an $SiO_2$ surface by a carefully controlled CVD of Si. The chemicals used for this epitaxial grown can be $SiCl_4$, $SiHCl_3$, $SiH_2Cl_2$ or $SiH_4$ in $H_2$ carrier gas in a conventional epi reactor, or, once again, the Applicant's invention (Ref. 3: A. N. Saxena, "Apparatus for Selective chemical Vapor Deposition of Dielectric, Semiconductor and Conductive Films on Semiconductor and Metallic Substrated", U.S. Pat. No. 5,472,508, Dec. 5, 1995) can be used. Similarly, nucleation sites for other materials can be created by using an appropriate mask for the desired single crystal orientation, and implanting/depositing the desired nucleation species through such a mask. Subsequent to this, epitaxial growth for the desired single crystal can be employed.

BRIEF DESCRIPTION OF THE DRAWINGS

FIG. 1 is a schematic view of a mask for use in forming nucleation sites for carrying out the process of the present invention;

FIG. 2 is a view similar to FIG. 1 but showing a single crystal semiconductor layer for growth on a silicon dioxide layer;

FIG. 3 is a view of the Miller indices of important planes in a cubic crystal;

FIG. 4 is a schematic representation of the diamond lattice unit cell;

FIG. 5 is a schematic representation of the trajectories in an actual channel for various entrance angles of a beam; and FIG. 6 is a schematic view of the channeling of an ion beam for forming a single crystal layer on a silicon dioxide layer.

DETAILED DESCRIPTION OF THE PREFERRED EMBODIMENT

The process of the present invention is carried out by directing an ion beam, denoted by the dash line arrows 10, through a mask 12 wherein the mask face 14 is perpendicular to the incoming beam 10. The beam typically will be vertical.

Beams 10 pass through the mask 12 and into the underlying amorphous layer 18 for creation of nucleation sites.

FIG. 3 shows various planes of a cubic crystal. The planes are, from left to right, the 100 plane, the 110 plane, and the 111 plane. Another crystal lattice view, namely a view of a diamond lattice unit cell is shown in FIG. 4.

FIG. 5 is a schematic representation of ion trajectories in an axial channel for various entrance angles of the ion beam.

FIG. 6 shows the incoming ion beam which moves past a mask and on to a silicon dioxide substrate.

More specifically, let us assume that a single crystal Si layer having (100) orientation needs to be grown on the $SiO_2$ layer. Let the lattice constant for (100) Si be "a". The exact value of "a" for Si is well known and can be found in any textbook. The symbol "a" is being used here for generic purposes, because this invention can allow the growth of almost any material. The implementation of this invention consists primarily of three key steps described below.

Preparation of the Mask: Cut, thin and polish a single crystal of a suitable material, e.g. Si, along a direction such that the channeling directions through it are "a" apart. The channeling direction in a single crystal is the direction through which an aligned beam of ions proceeds essentially undisturbed, i.e. they maintain the directionality of the ions. Thus, ions get deposited/implanted in a 2-D array replicating the matrix of the mask which is assumed in this case to be "a" apart in both the X- and Y-directions. For some crystals, it can be a rectangular, hexagonal, or any other array of nucleation sites, which are given by the appropriate single crystal masks. For simplicity, FIGS. 1 and 6 show mask 12 with a square array for forming equidistant nucleation sites A, B, C and D at a distance "a" apart. The fabrication technology for such a mask with a holding ring, is the same as that for the technology used for making masks for X-ray lithography.

Creation of Nucleation Sites: Place the $SiO_2$ surface of the Si IC wafer under the mask prepared in the above step. Align the mask such that the ion beam used for implanting/depositing the nucleation sites is parallel to the channeling direction of the mask. Implant Si with a low energy (e.g. 30 KeV) and high dose ($>10^{16}/cm^2$) through the mask. This step creates nucleation sites in the $SiO_2$ surface for the subsequent single crystal deposition of Si (layer 16). The masks can be much smaller than the Si IC wafer, and the latter can be translated under the mask to cover the entire area wherever needed. This is shown in FIG. 2.

The above example has been given for the deposition of a single crystal Si of (100) crystal orientation on $SiO_2$. The implanted Si nucleation sites have dangling bonds which bind with the incoming Si atoms deposited by the process described in the next step. Similarly, nucleation sites for other atoms can be created by choosing the right species of atoms and the mask appropriate for the crystal structure desired.

Epitaxial Growth: Use a CVD process suitable for a conventional Si epitaxy to grow single crystal layers of Si on the substrate having the nucleation sites created in the previous step, or use the Applicant's invention (Ref. 3) for an improved process to deposit single crystal layer of Si. The usual thicknesses of the epitaxial Si films for device/IC fabrication range between 0.05–0.5 $\mu$m. With the Applicant's invention (ibid) Si epitaxy can be achieved at a temperature (700–850° C.) which is lower than that (1000–1100° C.) with the conventional CVD process. The advantage of this is in keeping the device profiles more or less intact with the former improved process (ibid).

The above process steps cannot only give single crystal Si grown on $SiO_2$ on processed Si IC wafers, but it can also achieve that on a processed compound semiconductor, e.g. GaAs wafer. Many variations of this invention can be made without departing from the key concept of growing single crystal films on amorphous or non-crystalline substrates. This can be achieved by changing materials, channeling masks, and substrates for a desired combination necessary for a single crystal of a material.

What is claimed is:

1. A device comprising:
   (a) a non-single crystal substrate; and
   (b) a pattern of regularly spaced-apart nucleation sites defined in said substrate, wherein each respective one of said spacings between adjacent nucleation sites corresponds to a respective lattice constant of a single crystal of a predefined substance.

2. The device of claim 1 wherein said non-single crystal substrate is composed of an amorphous material.

3. The device of claim 1 wherein said non-single crystal substrate is composed of an electrically insulating material.

4. The device of claim 1 wherein said non-single crystal substrate includes an oxide of silicon.

5. The device of claim 4 wherein said single crystal substance is monocrystalline silicon.

6. The device of claim 1 wherein said non-single crystal substrate includes an nitride of silicon.

7. The device of claim 1 wherein said single crystal substance is monocrystalline silicon.

8. The device of claim 7 wherein said spacings correspond to a (100) orientation.

9. The device of claim 1 wherein said single crystal substance is a semiconductor.

10. The device of claim 1 further comprising:
(c) a single crystal layer of said predefined substance epitaxially grown from said spaced-apart nucleation sites.

11. The device of claim 1 wherein said pattern includes a two-dimensional flat pattern exposed on a flat major surface of said substrate and said spacings between the nucleation sites are respectively equal to corresponding one or more lattice constants of the predefined single crystal substance.

12. The device of claim 1 wherein said pattern of nucleation sites is implanted in said substrate.

13. A method comprising the step of:
(a) defining in a non-single crystal substrate, a pattern of regularly spaced-apart nucleation sites, where the regular spacings between adjacent nucleation sites each correspond to a respective lattice constant of a single crystal of a predefined substance.

14. The method of claim 13 wherein said non-single crystal substrate is composed of an amorphous material.

15. The method of claim 13 wherein said non-single crystal substrate is composed of an electrically insulating material.

16. The method of claim 13 wherein said non-single crystal substrate includes an oxide of silicon.

17. The device of claim 16 wherein said single crystal substance is monocrystalline silicon.

18. The method of claim 13 wherein said non-single crystal substrate includes a nitride of silicon.

19. The device of claim 15 wherein said single crystal substance is monocrystalline silicon.

20. The device of claim 19 wherein said spacings correspond to a (100) orientation.

21. The method of claim 13 wherein said single crystal substance is a semiconductor.

22. The method of claim 13 wherein said step of defining includes:
(a. 1) implanting a nucleating species through a single crystal mask having regularly-spaced channels whose spacings correspond to the regular spacings of said nucleation sites.

23. The method of claim 22 wherein said nucleating species includes silicon.

24. The method of claim 22 wherein said implanting of a nucleating species includes implanting of ions at a low energy of no more than about 30 KeV.

25. The method of claim 22 wherein said implanting of a nucleating species includes implanting of ions at a dose greater than $10^{16}/cm^2$.

26. The method of claim 13 further comprising the step of:
(b) epitaxially growing a single crystal layer of said predefined substance from said spaced-apart nucleation sites.

27. The method of claim 1 wherein said pattern includes a two-dimensional flat pattern exposed on a flat major surface of said substrate and said spacings between the nucleation sites are respectively equal to corresponding one or more lattice constants of the predefined single crystal substance.

28. A device produced from a pattern-imprinting process and having a non-single crystal substrate, where within said pattern-imprinting process, beams of a nucleating species are passed through a single-crystal mask for implantation into the non-single crystal substrate to thereby imprint said non-single crystal substrate with a pattern of said nucleating species which passed through spaced-apart channels of the single crystal mask, the device thereafter being characterized by:
(a) a pattern of regularly spaced-apart nucleation sites defined in said substrate, wherein each respective one of said spacings between the nucleation sites corresponds to a respective lattice constant of said single crystal mask.

* * * * *

UNITED STATES PATENT AND TRADEMARK OFFICE
CERTIFICATE OF CORRECTION

PATENT NO. : 6,103,019
DATED : August 15, 2000
INVENTOR(S) : Arjun Saxena

It is certified that error appears in the above-identified patent and that said Letters Patent is hereby corrected as shown below:

Title page,
Item [76], address should be -- 4217 Pomona Avenue, Palo Alto, Calif. 94306 --.

Column 2,
Line 46, "an is example" should be -- an example --.

Column 3,
Line 13, "chemical" should be -- Chemical --;
Line 15, "Substrated" should be -- Substrates --.

Column 5,
Line 39, "device" should be -- method --;
Line 43, "device of claim 15" should be -- method of claim 13 --.

Column 6,
Line 1, "device" should be -- method --;
Line 23, "claim 1" should be -- claim 13 --.

Signed and Sealed this

Twenty-third Day of October, 2001

Attest:

NICHOLAS P. GODICI

*Attesting Officer*   *Acting Director of the United States Patent and Trademark Office*